(12) United States Patent
Smayling et al.

(10) Patent No.: US 7,459,319 B2
(45) Date of Patent: *Dec. 2, 2008

(54) METHOD AND APPARATUS FOR CHARACTERIZING FEATURES FORMED ON A SUBSTRATE

(75) Inventors: Michael C. Smayling, Sunnyvale, CA (US); Susie Xiuru Yang, Sunnyvale, CA (US); Michael P. Duane, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/681,843

(22) Filed: Mar. 5, 2007

(65) Prior Publication Data

US 2007/0145998 A1 Jun. 28, 2007

Related U.S. Application Data

(62) Division of application No. 11/128,133, filed on May 12, 2005, now Pat. No. 7,196,350.

(51) Int. Cl.
H01L 23/58 (2006.01)
H01L 21/00 (2006.01)
(52) U.S. Cl. .......................................... 438/14; 438/16
(58) Field of Classification Search .................. 438/14, 438/16
See application file for complete search history.

(56) References Cited

U.S. PATENT DOCUMENTS 6,552,812 B1  4/2003  Xu et al.
6,721,922 B1  4/2004  Walters et al.
7,196,350 B2 * 3/2007  Smayling et al. .............. 257/48

OTHER PUBLICATIONS

Park, et al., Multi-Level Test Mask Documentation for Low K Dielectric and Copper Damascene CMP Process, Massachusetts Institute of Technology, 1999, pp. 1-78.

Park, et al., Integrated Chip-Scale Prediction of Copper Interconnect Topography, MRS Spring Meeting, Symposium F: Chemical Mechanical Planarization, San Francisco, CA, Apr. 2003.

Lafevre, et al., Direct Measurement of Planarization Length for Copper Chemical Mechanical Polishing (CMP) Processes Using a Large Pattern Test Mask, Materials Research Society (MRS) Spring Meeting, San Francisco, CA, Apr. 2001.

(Continued)

*Primary Examiner*—Evan Pert
(74) *Attorney, Agent, or Firm*—Patterson & Sheridan, LLP (57) ABSTRACT

A method and apparatus for testing and characterizing features formed on a substrate. In one embodiment, a test structure is provided that includes a test element having a first side and an opposing second side. A first set of one or more structures defining a first region having a first local density are disposed adjacent the first side of the test element. A second set of one or more structures defining a second region having a second local density are disposed adjacent the second side of the test element. A third set of one or more structures defining a third region having a first global density are disposed adjacent the first region. A fourth set of one or more structures defining a fourth region having a second global density are disposed adjacent the second region.

21 Claims, 6 Drawing Sheets

OTHER PUBLICATIONS

Schellenberg, Lithography: The Integration of TCAD and EDA, Semiconductor International, Wilsonville, Oregon, Feb. 1, 2004.

Park, et al., Chip-Scale Modeling of Electroplated Copper Surface Profiles, Journal of the Electrochemical Society, 151(6), C418-C430 (2004).

Toprac, et al., The Status and Future of APC Software, Yield Dynamics, Inc., Austin, Texas, date unknown.

Gostein, et al., Characterizing and Monitoring Copper CMP Using Nondestructive Optoacoustic Metrology, Micro Magazine.com, pp. 1-13, date unknown.

Wafer Nanotopography, MEMC, Application Note AE-008, Aug. 2001.

http://www.praesagus.com/site/wafers/300/cu/, date unknown.

* cited by examiner

METHOD AND APPARATUS FOR CHARACTERIZING FEATURES FORMED ON A SUBSTRATE

CROSS-REFERENCE TO RELATED APPLICATIONS

This application is a divisional application of U.S. patent application Ser. No. 11/128,133, filed May 12, 2005 now U.S. Pat. No. 7,196,350 (APPM/8820), which is incorporated by reference herein.

BACKGROUND OF THE INVENTION

1. Field of the Invention

Embodiments of the present invention generally relate to methods and apparatus for modeling and characterization of features formed on semiconductor substrates.

2. Description of the Related Art

Integrated circuits have evolved into complex devices that can include millions of components (e.g., transistors, capacitors, resistors, and the like) on a single chip. The evolution of chip designs continually requires faster circuitry and greater circuit density. Circuit density has a pronounced importance as the speed and number of functions a circuit can execute increases along with the density of the circuit structure. The demands for greater circuit density necessitate a reduction in the dimensions of the integrated circuit components.

Due to the reduction in dimensions, copper has become a choice metal for filling the sub-micron, high aspect ratio interconnect features needed for the next generation of ultra large scale integration. This is because copper and its alloys have lower resistivities and significantly higher electromigration resistance as compared to previously used materials. These characteristics are important for supporting the higher current densities experienced at high levels of integration and increased device speed.

Test chips have long been used to predict performance of features formed on the chip and to detect process variation during manufacture. For example, test chips have been used to predict and monitor CMP performance of silicon oxide and tungsten structures for interconnect applications. As both silicon oxide and tungsten are relatively hard and have long planarization distances, test chips having test structures on the order of 4 mm$^2$ or larger were developed and used for these materials.

However, the dramatic changes seen in the processes and materials used to manufacture today's smaller, faster circuits has not seemed to change the test chip design mentality. Traditional millimeter scale test structures are still being used in copper design prediction and process monitoring even though the copper and low-k materials currently used in damascene and dual damascene processes are significantly softer than tungsten and oxide.

It has been observed that small features may not perform as predicted by the larger, conventional test chips and that, therefore, the phenomena and understanding gained from these large test structures cannot be scaled down to predict the performance of small feature chips. In addition, it has been observed that how copper is initially polished plays a critical role in final device performance.

Thus, there is a need for an improved method and apparatus for modeling and characterization of small-feature integrated circuits.

SUMMARY OF THE INVENTION

The present invention generally provides a method and apparatus for testing and characterizing features formed on a substrate. In one embodiment, a test structure is provided that includes a test element having a first side and an opposing second side. A first set of one or more structures defining a first region having a first local density are disposed adjacent the first side of the test element. A second set of one or more structures defining a second region having a second local density are disposed adjacent the second side of the test element. A third set of one or more structures defining a third region having a first global density are disposed adjacent the first region. A fourth set of one or more structures defining a fourth region having a second global density are disposed adjacent the second region.

In another embodiment, a test chip is provided that includes a substrate and one or more test modules disposed on the substrate. Each of the test modules includes at least one test group. The test groups include a test element, a first and a second region of local density, the first and the second regions of local density having the test element disposed therebetween, and a first and a second region of global density, the first region of global density disposed adjacent the first region of local density, and the second region of global density disposed adjacent the second region of local density.

In another embodiment, a test chip is provided that includes a substrate having one or more test modules disposed thereon. Each of the test modules include at least one test group and each test group includes a test element, a first and a second region of local density having the test element disposed therebetween, and a first and a second region of global density. The first region of global density is disposed adjacent the first region of local density. The second region of global density is disposed adjacent the second region of local density.

In another embodiment, an article of manufacture is provided that includes a substrate having a plurality of integrated circuits partially or completely formed thereon. One or more test modules are formed in the substrate in one or more areas disposed between the plurality of integrated circuits. Each of the test modules includes at least one test group. Each test group includes a test element, a first and a second region of local density having the test element disposed therebetween, and a first and a second region of global density. The first region of global density is disposed adjacent the first region of local density. The second region of global density is disposed adjacent the second region of local density.

In another aspect of the invention, a method of determining the effect of surrounding structures on a test structure formed on a semiconductor substrate is provided. The method includes providing a substrate having a test group formed thereon, wherein the test group includes a test element having a first side and an opposing second side. One or more structures are disposed on the substrate and define a first region having a first local density adjacent the first side of the test element. One or more structures are disposed on the substrate and define a second region having a second local density adjacent the second side of the test element. One or more structures are disposed on the substrate and define a third region having a first global density adjacent the first region. One or more structures are disposed on the substrate and define a fourth region having a second global density adjacent the second region. A first measurement of a characteristic of the test element is taken.

In another embodiment, a method of forming an information library for use in designing or fabricating integrated circuits is provided. The method includes providing a test chip having one or more test modules formed thereon, each test module having one or more test groups. The test groups include a test element having a first side and an opposing second side, and a first and a second region of local density respectively adjacent the first and the second side of the test element. A first and a second region of global density respectively adjacent the first and the second region of local density is also provided on the test chip. A characteristic of one or more of the test elements is measured. Data representing the measured characteristic is then stored in a database.

In another embodiment, a method of monitoring a process is provided. The method includes performing a process in a semiconductor process tool. A substrate having a test group formed thereon is inserted into the tool. The test group includes a test element having a first side and an opposing second side and one or more structures defining a first region having a first local density adjacent the first side of the test element. One or more structures is formed on the substrate and defines a second region having a second local density adjacent the second side of the test element. One or more structures is formed on the substrate and defines a third region having a first global density adjacent the first region. One or more structures is formed on the substrate and defines a fourth region having a second global density adjacent the second region. The process is performed on the substrate. A measurement of a characteristic of the test element is then taken.

In another embodiment, a method of monitoring a process is provided. The method includes forming a test module in a region located between product dies on a substrate, wherein the test module includes at least one test group and the test group includes a test element and a first and a second region of local density, the first and the second regions of local density having the test element disposed therebetween. A first and a second region of global density is formed on the substrate, the first region of global density is disposed adjacent the first region of local density and the second region of global density is disposed adjacent the second region of local density. A process is performed on the substrate. A characteristic of the test module is measured.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of compact testing structures and test chips utilizing such structures are disclosed herein. The test structures are relatively small and may be used in test chips and in scribeline test structures. The test structures may be electrically or physically tested to characterize the influences of processes, such as, CMP, lithography, etching, and the like, on structures formed on a substrate. Various methods of use of the compact test structures are further disclosed herein.

Figures 1A, 1B:
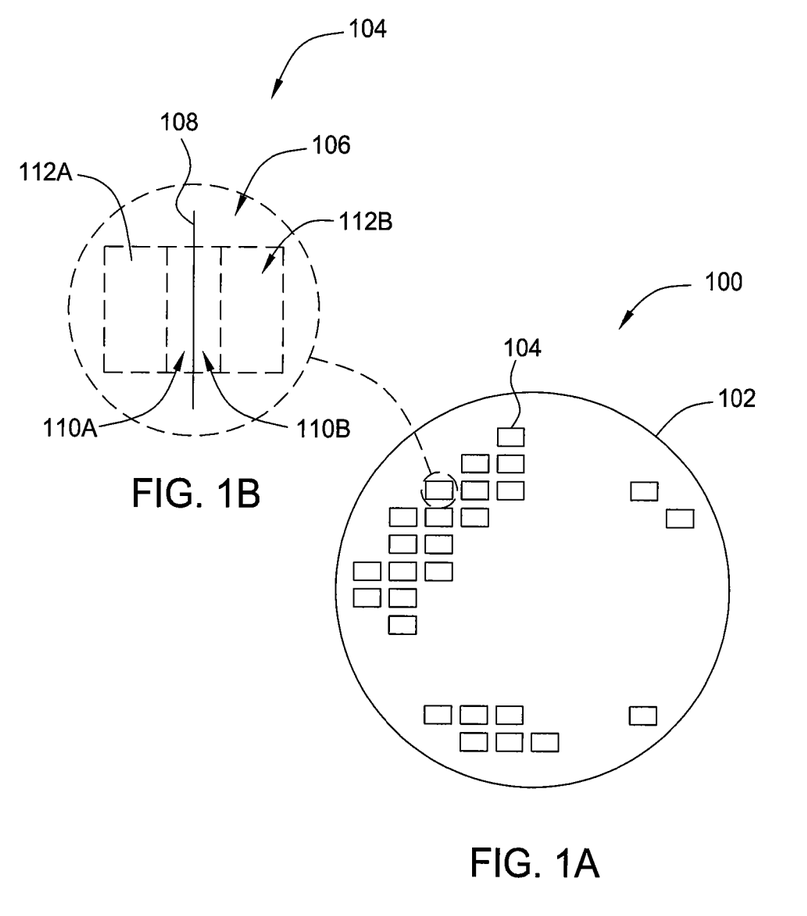
FIGS. 1A and 1B depict a simplified plan view and detail of one embodiment of a test chip of the present invention.

FIG. 1A depicts a plan view of a test chip 100 of the present invention. The test chip 100 generally comprises a plurality of test structures, or modules 104 arranged on a substrate 102. In the embodiment depicted in FIG. 1A, the plurality of modules 104 are arranged in a grid pattern that substantially fills or covers the upper surface of the substrate 102. Alternatively, the plurality of modules 104 may be arranged in any geometric or random pattern on the substrate 102. The substrate 102 is generally a conventional semiconductor substrate, such as a 200 or 300 millimeter silicon wafer. It is contemplated that the test modules 104 may be formed on a substrate 102 having other devices formed thereon, such as partially or completely formed integrated circuits. For example, the test modules 104 may be formed on production substrates in the scribe lines between production dies, as described more fully below. Alternatively, substrates made of other materials or having other shapes or sizes may be used as a support base for the plurality of modules 104.

FIG. 1B depicts a simplified detail of one of the plurality of modules 104. Each module 104 includes one or more test groups 106 that include a test element—i.e., a line or device that is to be tested, referred to as a device under test, or DUT 108. The DUT 108 is a feature (e.g., a line) formed in the substrate and typically comprises a conductive metal, e.g., copper, suitable for use as an interconnect in an integrated circuit. The DUT 108 may be selected to reflect a design rule utilized in the design of an integrated circuit. The DUT 108 is formed to a desired width to be tested and is generally formed to the same thickness (i.e., depth) as desired in an actual integrated circuit in order to more accurately predict actual performance. In one embodiment, the DUT 108 is formed to a thickness of from about 1000 to about 10,000 Angstroms.

In one embodiment, each test group 106 includes a first and a second region of local density 110A, 110B (collectively 110) and a first and a second region of global density 112A, 112B (collectively 112) surrounding the DUT 108. As referred to herein, the terms local density and global density refer to either the respective region of local or global density, or the actual density of features within that region, as appropriate.

The regions of local density 110 and global density 112 are formed by one or more features formed in the substrate within each respective region and having a predefined ratio of conductive to non-conductive surface area. The DUT 108 is typically centrally disposed within the test group 106 and has the regions of local density 110A and 110B disposed on each side of the DUT 108. The regions of global density 112A and 112B flank the regions of local density 110, as depicted in FIG. 1B.

The regions of local density 110A, 110B may be uniform and symmetrical in either size or density on each side of the DUT 108. Similarly, the regions of global density 112A, 112B may be uniform and symmetrical in either size or density on each side of the regions of local density 110. Alternatively, either or both of the local and global densities 110A-B, 112A-B may be asymmetrical about the DUT 108.

In one embodiment, the regions of local density 110 and global density 112 are formed by a plurality of metal lines formed in the substrate having predefined line widths and line spacing, as described in more detail below. For both the local and the global densities, the density of the region is defined by the line width of the lines formed in that region divided by the line width plus the spacing between the lines in that region. For example, the local and global densities 110, 112 can be more easily understood and defined with respect to FIG. 2, which depicts a plan view of one embodiment of the test group 106. The DUT 108, having a width $W_{DUT}$ is centered in the test group 106. One or more lines 202 are disposed on each side of the DUT 108 (depicted in FIG. 2 as one line on each side of the DUT 108). The lines 202 have a width $W_L$ and are spaced apart from the DUT 108—and each other in embodiments where there are multiple lines 202—by a spacing $S_L$. The lines 202 having a line width $W_L$ and spacing $S_L$ comprise the region of local density 110. The local density in the region 110 is defined by the sum of the widths $W_L$ of the lines 202 divided by the sum of the sum of the widths $W_L$ plus the sum of the spacings $S_L$.

Figure 2:
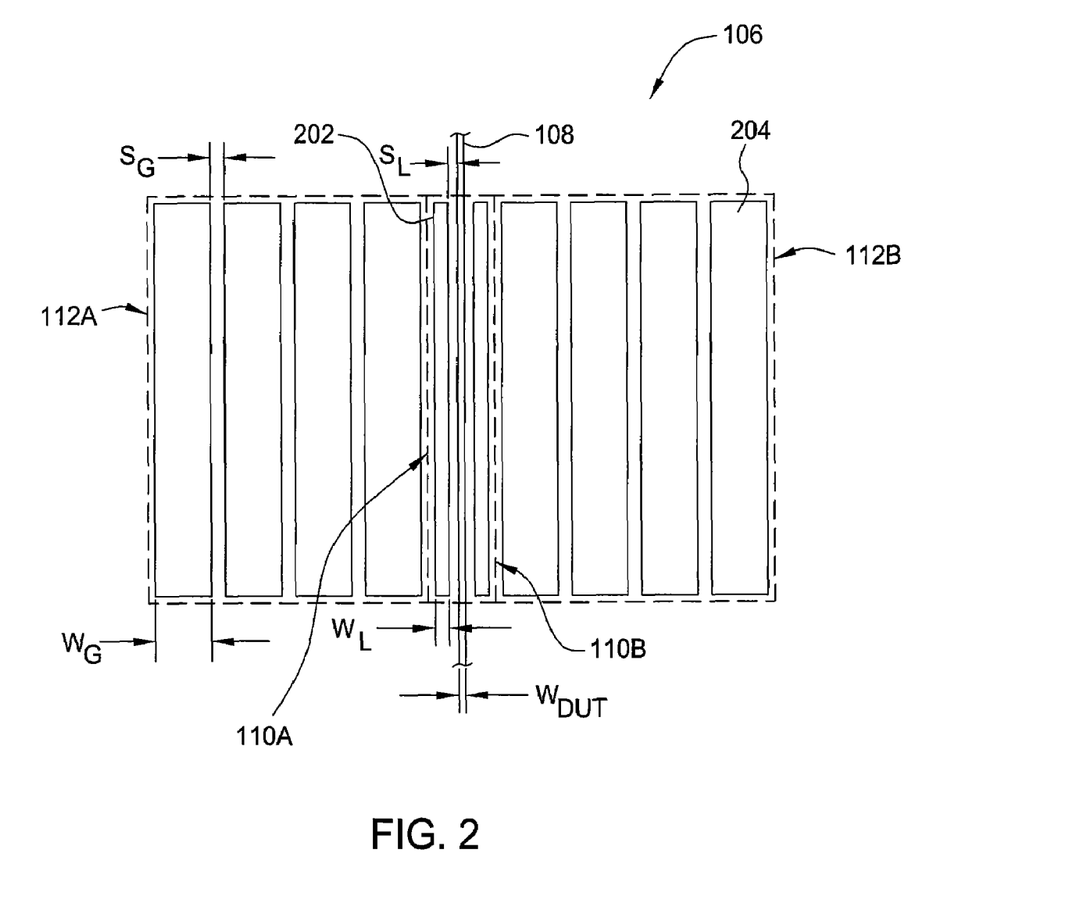
FIG. 2 is a plan view of one embodiment of a test group.

The region of local density 110 is generally defined by the range of optical sensitivity when patterning the lines 202 and typically comprises from about 1 to 3 lines 202 on each side of the DUT 108. In one embodiment, the regions of local density 110A and 110B are about 1 to about 2 μm on each side of the DUT 108. Although the lines 202 depicted in FIG. 2 are linear and parallel to the DUT 108, it is contemplated that the lines 202 may be perpendicular to the DUT 108, or at some other angle to the DUT 108. The lines 202 can also be discontinuous, i.e., have gaps (not shown) formed along the length of the lines 202, or may be non-linear. The local lines 202 are typically 1-5 lambda, wherein lamba is a constant that correlates to the minimum design rule size for a particular layer of a integrated circuit, for example, 100 nm.

One or more lines 204 having a width $W_G$ and a spacing $S_G$ are disposed on each side of the area including the line 108 and the regions of local density 110. The lines 204 together define the global density 112, which is numerically defined as the sum of the widths $W_G$ of the lines 204 divided by the sum of the sum of the widths $W_G$ plus the sum of the spacings $S_G$. The width $W_L$ of the lines 202 may be less than, the same as, or greater than the width $W_G$ of the lines 204. Similarly, the spacing $S_L$ between the lines 202 and the device under test 108 or additional lines 202 may be the same as, less than or greater than the spacing $S_G$ between lines 204 in the region of global density 112. In other words, the local and global densities 110, 112 are independent of each other and they may be either equal or different.

In one embodiment, the regions of global density 112A and 112B are about 20 to about 100 μm on each side of the DUT 108. Although the lines 204 depicted in FIG. 2 are linear and parallel to the DUT 108, it is contemplated that the lines 204 may be perpendicular to the DUT 108, or at some other angle to the DUT 108. The lines 204 can also be discontinuous, i.e., have gaps (not shown) formed along the length of the lines 204, or may be non-linear. The global lines 204 are typically about 1 to about 40 lambda.

Although depicted as uniform, parallel lines in FIG. 2, it is contemplated that the features formed in one or more of the regions of local density 110A-B and global density 112A-B may comprise other geometries. For example, the local or global lines 202, 204 may be formed at an angle to the DUT 108, rather than parallel. Alternatively, the features formed in one or more of the regions of local density 11A-B and global density 112A-B may not even be continuous rectangular lines at all, but instead be discontinuous lines, bent or wavy lines, squares, circles, arcs, blobs or amorphous shapes, or any other shape or form, including, for example, fully or partially formed devices.

Furthermore, it is contemplated that the local and/or global density may range from 0 to 100 percent. For example, there may be no local lines 202 or global lines 204 in the regions of local or global density 110A-B, 112A-B (e.g., density may equal 0 percent), or the global line 204 may comprise a solid block of metal filling one or more of the entire regions of local or global density 110A-B, 112A-B (e.g., density may equal 100 percent).

In one embodiment, the width $W_{DUT}$ of the DUT 108 ranges from about 100 nanometers to about 350 nanometers. It is contemplated that the width $W_{DUT}$ of the DUT 108 may also be larger or smaller depending upon the lambda, or design rule, of interest. The width $W_L$ of the local lines 202 in the region of local density 110 ranges from about 100 nanometers to about 350 nanometers. The spacing $S_L$ ranges from about 110 nanometers to about 350 nanometers. The width $W_G$ of lines 204 range from about 200 nanometers to about 900 nanometers. The spacing $S_G$ of the lines 204 range from about 200 nanometers to about 900 nanometers. It is contemplated that other widths and spacings may be used for the DUT 108, the lines 202 of local density 110, and the lines 204 of global density 112 in order to measure or test different combinations of line width and spacing arrangements and densities for different devices.

Figure 3:
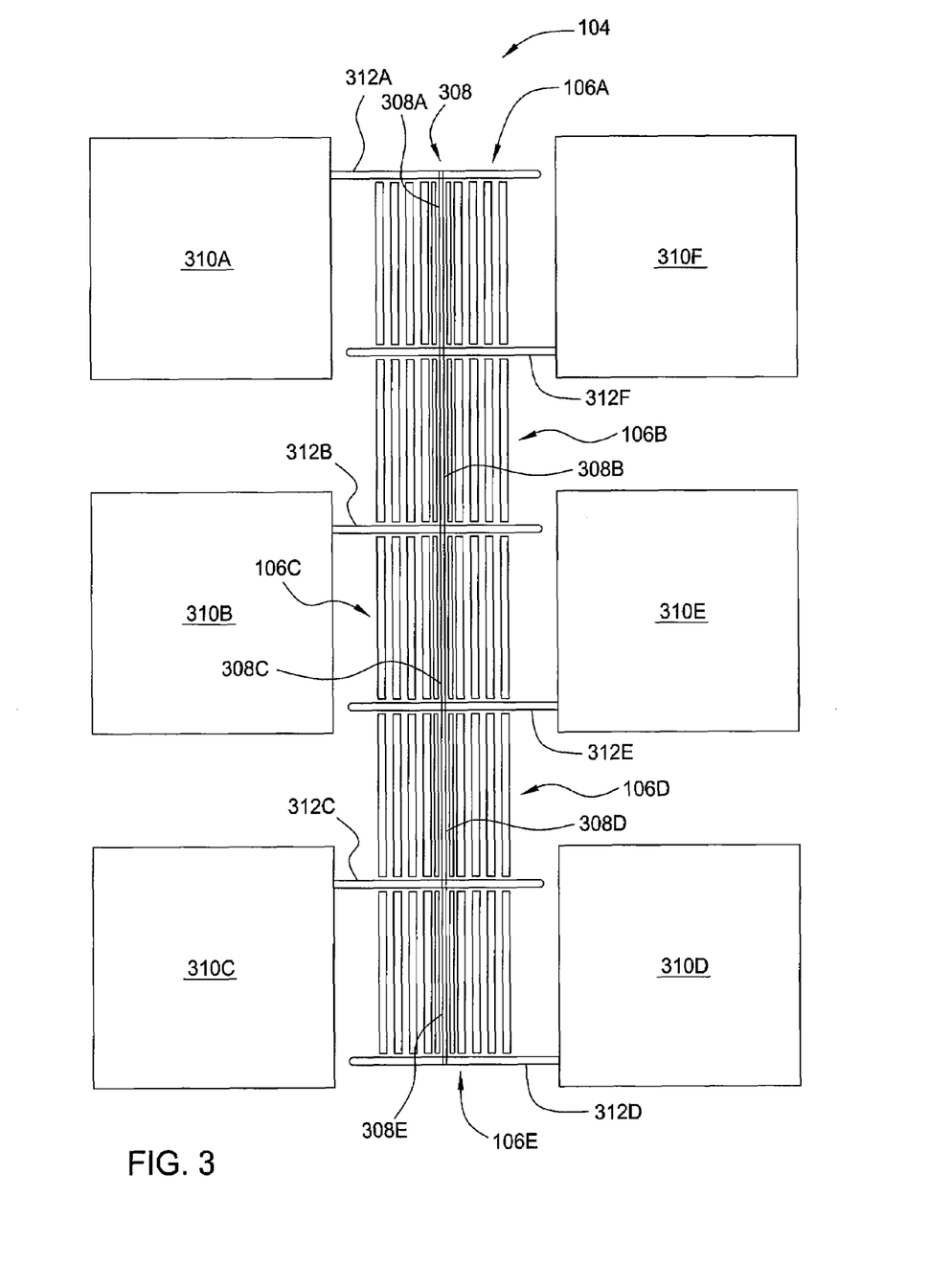
FIG. 3 is a plan view of one embodiment of a test module of the test chip.

FIG. 3 depicts a diagram of one illustrative embodiment of the test module 104 having five test groups, labeled 106A-E. A DUT 308, having regions 308A through 308E, runs through each of the test groups 106A-E. The DUT 308 may be a continuous line formed in the substrate and having a uniform width and depth to facilitate manufacture of the test chip. However, it is also contemplated that the DUT 308 may have differing dimensions in each region 308A-E of the DUT 308.

In the embodiment depicted in FIG. 3, each test group 106A-E is generally about 40 μm wide and about 50 μm long. A plurality of bond pads 310A-F may be provided if electrical measurements of the DUT 308, such as resistance, are desired. A connection 312A-F is provided at each end of the test group 106A-E to one of the bond pads 310A-F. Utilizing such an arrangement, four-terminal resistance measurements of the respective DUT 308A-E may be taken from each of the test groups 106A-E with the exception of the first and last test group 106 (test group 106A and 106E in FIG. 3) which serve as dummy groups. For example, a probe may be connected to the bond pads 310A, 310B, 310F, and 310E to obtain a four terminal resistance measurement of the DUT 308B. Similarly, a probe may be connected to the bond pads 310B, 310C, 310F, and 310E to obtain a four terminal resistance measurement of the DUT 308C, and so on.

An advantage of the small size of the test groups 106A-E is the ability to place the test groups 106A-E between the bond pads 310A-F to conserve space on the test chip and to allow greater numbers of test groups to be placed on the test chip. For example, in one embodiment (not shown), 31 test groups 106 are arranged in a line in a single test module 104, allowing for 29 four-point resistance measurements of the DUT 108 to be taken. Each test module 104 also comprises 32 bond pads 310 arranged on either side of the test groups 106 to facilitate the resistance measurements. The bond pads 310 are arranged in a 2 by 16 array and are connected to the either side of the DUT 108 similarly as shown in FIG. 3. Such a layout only occupies an area roughly 250 μm by about 1650 μm and allows many test modules 104 to be placed on a test chip 100 comprising, for example, a 300 mm semiconductor substrate.

As each test group 106 may comprise varying local and global densities 110, 112, this arrangement allows for efficient measurement of devices under many different combinations of geometries (i.e., DUTs surrounded by differing local and global densities).

Another advantage of the layout described in FIG. 3 is the ability to assess the effect of large features neighboring the devices under test, referred to herein as the "neighboring density." For example, in the embodiment depicted in FIG. 3, each of the bond pads 310A-F corresponds to a large-scale feature (relative to the device under test, DUT 108A-E). As can be seen from the figure, some test groups 106 are flanked by a pair of bond pads 310 (for example, test group 106C is flanked by the pair of bond pads 310B and 310E) and some test groups 106 are not (for example, test groups 106B and 106D are not directly flanked by any of the bond pads 310). By taking four-terminal resistance measurements of the DUT 108B-D within these test groups 106, the analysis can consider the effect that the large scale features have on the neighboring devices under test—i.e., the neighboring density can be factored into the analysis.

As each test group 106 and test module 104 may have the same or different widths of devices under test, local densities, and global densities, tremendous amounts of data may be collected on a single test chip. More importantly, the small size of the devices under test correlates to the actual sizes of features being formed on current integrated circuits. This advantageously allows for modeling of chip performance with more robust data, as compared to prior art test chips having much larger test structures.

Figures 4A, 4B:
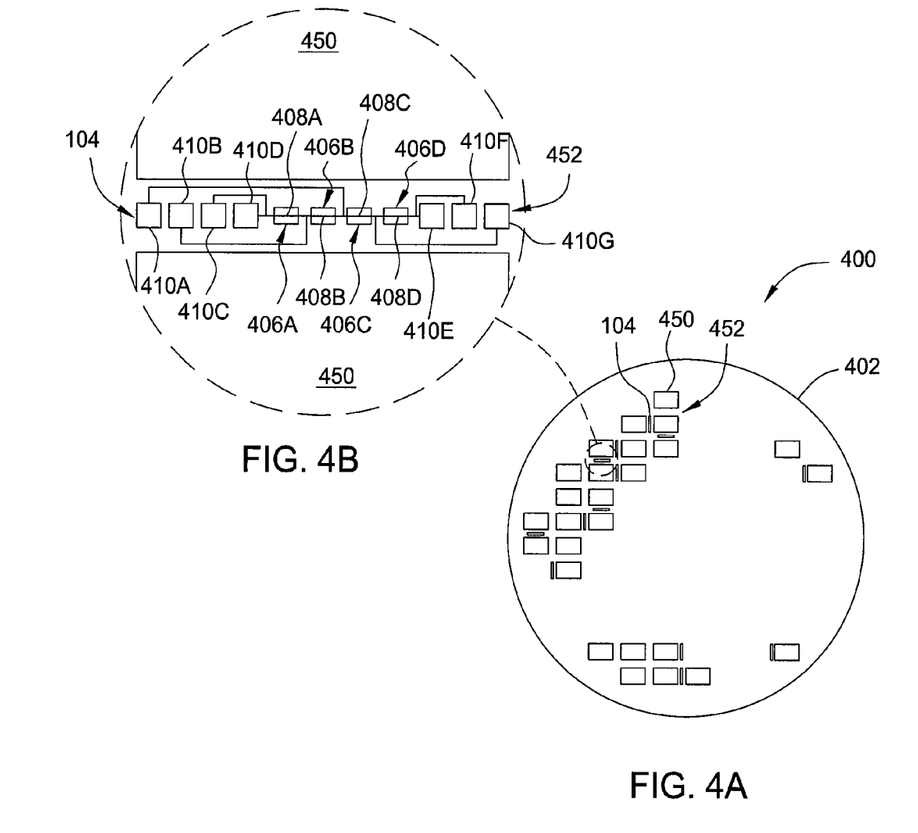
FIGS. 4A and 4B depict a plan view of another embodiment of a test module of the test chip.

Another embodiment, depicted with respect to FIGS. 4A and 4B, takes advantage of the small size of the test modules described above to incorporate the test modules into substrates having one or more integrated circuits at least partially formed thereon. For example, in the embodiment depicted in FIG. 4A, a substrate 400 has a plurality of regions 450 arranged on the surface of the substrate 400 for forming a plurality of integrated circuit chips thereon. The regions 450 are generally separated by a space 452 to accommodate the ultimate separation of regions 450 into individual chips upon completion of processing. At least one test module 104 is formed on the substrate 400. The test module 104 is placed in one of the spaces 452 between any two of the regions 450. In the embodiment depicted in FIG. 4A, a plurality of test modules 104 are disposed in a plurality of spaces 452 spread over the surface of the substrate 400.

As depicted in the detail of FIG. 4B, each test module 104 comprises one or more test group 406 (four test groups 406A-D shown). The test groups 406 are similar to the test groups 106 in the embodiments described above, e.g., having a DUT, regions of local density, and regions of global density. In the embodiment depicted in 4B, each test group 406A-D contains a corresponding DUT 408A-D. A plurality of bond pads 410A-G is coupled to the DUTs 408A-D to facilitate taking four-point resistance measurements of each DUT 408A-D. The test groups 406A-D and the bond pads 410A-G are arranged in a linear array so that the test module 104 may fit in the standard space 452 between the regions 450 without adversely affecting product yield. In current production substrates, the space is typically between about 80 to about 100 μm wide. However, it is contemplated that the test modules 104 may be utilized in regions having other widths as well.

The width of the DUT and the local and global densities may be varied as described above. However, in a production situation, the DUTs may be set to reflect the width and/or depth of the actual integrated circuits being fabricated. In addition, the regions of local and global density may also be tailored to correspond to the local and global densities of the integrated circuits being fabricated. As such, the processes being performed on the substrate in order to form the integrated circuits may be monitored via the test groups. For example, a resistance measurement may be taken from each of the test groups before and/or after each process (i.e., each step in the fabrication process). These resistance measurements may be compared to a control value or charted over time to monitor process variation, quality, and the like.

In addition, the test modules may be placed at various locations on the substrate. Therefore, as multiple test modules may be utilized, process variation in various locations across the substrate may be monitored as well. For example, measurements may be taken near the center and near the edge of the substrate and compared.

Figure 5:
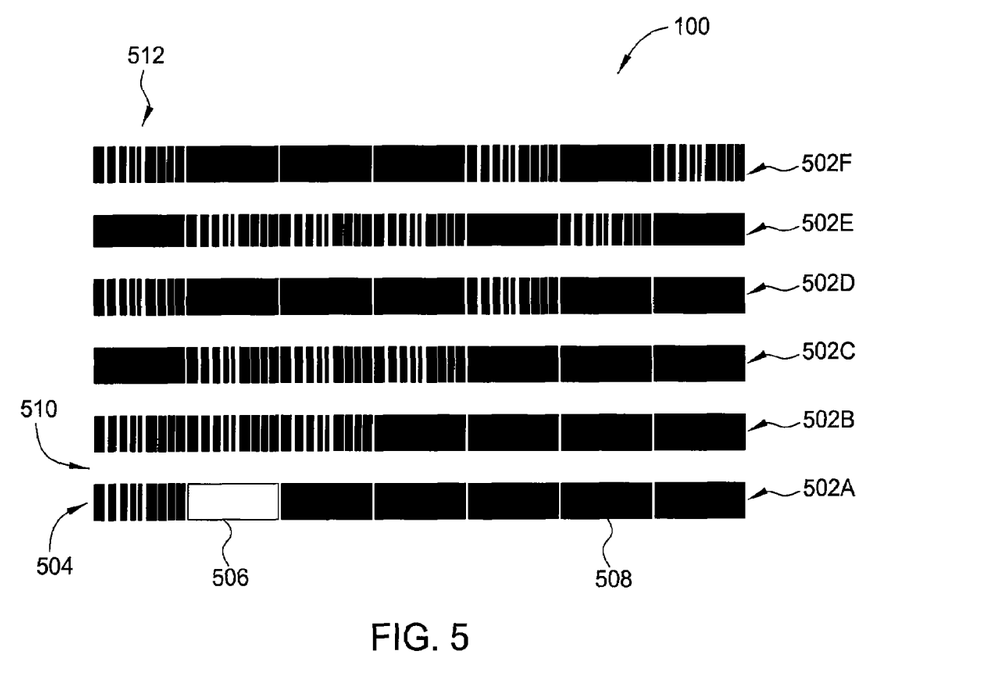
FIG. 5 depicts a partial side view of one illustrative embodiment of a test chip.

The test chip 100 may further comprise test structures or modules (e.g., test modules 104, 504, described above, or other test module) disposed in one or more layers formed on the substrate 102. FIG. 5 depicts one illustrative embodiment of a partial side view of a test chip 100 having a plurality of layers 502A-F. The layers 502A-F are typically about the same thickness as the line or device under test and are separated by dielectric layers 510. Each dielectric layer 510 is generally about the same thickness as each layer 502A-F. Each layer 502A-F comprises a plurality of different features formed therein. For example, each layer may comprise one or more of test modules as described above or solid blocks of dielectric or conductive materials. In the embodiment depicted in FIG. 5, layer 502A includes a block of dielectric material 506 and five blocks of a conductive material 508, for example, copper, in addition to a test module 504.

As can be seen from FIG. 5, the features formed in each layer 502A-F "stack up" over each other in columns of varying patterns. As such, the effect of the underlying topography (as illustrated by columns 512 in FIG. 5) on the test modules 504 may be examined. In this manner, the inventive test structures advantageously recognize that the performance of lines formed in an integrated circuit may be affected by surrounding lines, metal or dielectric layers, or other features formed around, above, and/or below the lines. It is to be noted that the configuration of the modules 504, dielectric material 506, and conductive material 508 is illustrative only and not indicative of any particular design, pattern, or configuration on any particular test chip 100.

Figure 6:
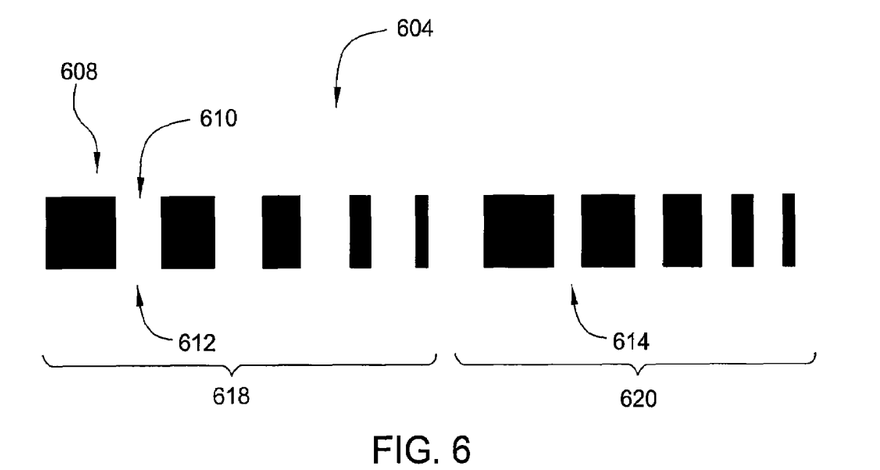
FIG. 6 depicts a plan view of another embodiment of a test group.

FIG. 6 depicts a plan view of another embodiment of a test group 604. In the embodiment depicted in FIG. 6, the test group 604 includes a plurality of test structures 608 separated by a predetermined spacing 610. As shown in FIG. 6, the test structures 608 may vary in size across the test group 604. In addition, the spacing 610 may be constant, may vary, or may be constant for some portion of the test group 604 and vary for others. For example, in the embodiment depicted in FIG. 6, the test structures 608 are about 100 μm tall and vary in width between 100 μm and 10 μm. The test structures 608 repeat in a pattern having a spacing 612 of 50 μm between a first set 618 of test structures 608 and a spacing 614 of 25 μm between a second set 620 of test structures 608.

The test structures 608 may comprise any material desired to be tested. For example, for testing performance of chemical mechanical processing (CMP) or electrochemical mechanical processing (ECMP) performance, the test structure may comprise a conductor typically used in integrated circuit wirelines, such as copper, or the like. The spaces 610 typically comprise the same materials as would be present on an actual integrated circuit, for example, a dielectric material separating the test structures 608.

The test structures 608 may be physically measured, for example by stylus or probe profilers, optical critical dimension (OCD), atomic force microscopes (AFM), and the like. The compact structures may be easily arranged to provide high spatial resolution test structures which give a clear picture of resistance variability across a wafer. For example, the test structures 508 may be formed on a blank test substrate for analyzing the effect desired processes have on the structures. Alternatively, the test structures 608 may be formed on an actual production substrate, for example, in the area of the scribe lines between the chips. Such an arrangement advantageously allows for monitoring of process variation over time and/or across varying areas of the substrate, e.g. at the center versus the edge of the substrate.

Embodiments of the test chip of the present invention have numerous advantageous uses to assist in the fabrication and design of integrated circuits. For example, one or more test chips may be used to evaluate and create a library of information useful for establishing or evaluating design rules utilized in the layout and design of interconnects and other structures on an integrated circuit chip. In one embodiment, an information library may be created by providing many variations of the test modules 104 stepped across the surface of the test chip 100 to form an array of test modules 104 having numerous combinations of line widths for the device under test 108, lines 202 of local density 110, and lines 204 of global density 112. The devices under test 108 may also be disposed in varying fields of local and global density 110, 112 and neighboring densities as described above. In addition, such structures may be built up in layers, as described with respect to FIG. 5, to evaluate the effect of topography, or underlying features, on the DUT 108.

A sheet resistance of the various DUTs 108 may then be obtained, such as through a four-terminal resistance measurement. Next, the measured resistance of the various DUTs 108 on the test chip 100 may be analyzed versus different variables, such as the local and global density, neighboring density, topography, and the like. Alternatively, or in addition, physical measurements may be taken to detect changes in the physical structure of the DUTs 108 such as by use of a stylus or through optical techniques as known in the art.

Figure 7:
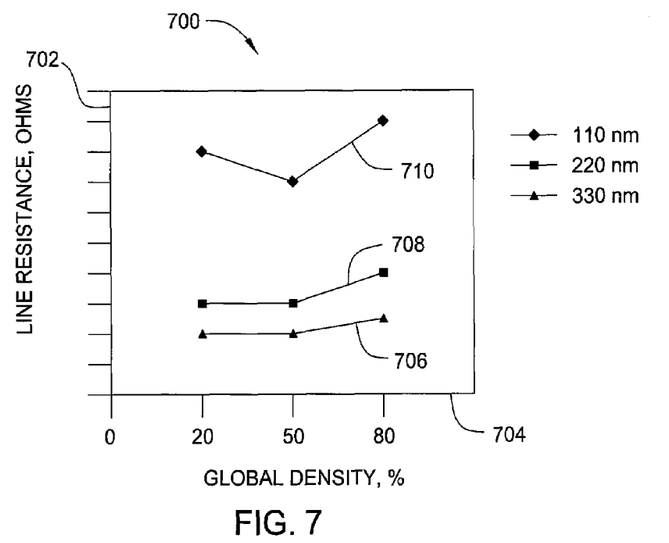
FIG. 7 is a graph of line resistance versus global density for devices having various line widths.

For example, FIG. 7 is a chart 700 depicting line resistance (axis 702) versus global density (axis 704) for various line widths. The data for this chart was obtained using a test chip as described above. As can be seen from the chart, the line resistance for 330 nm lines (line 706) and 220 nm line (line 708) increases as the global density increases from 20 to 80 percent. However, unexpectedly, the line resistance for 110 nm lines (line 710) decreased as global density moved from 20 to 50 percent, then increased again as global density moved from 50 to 80 percent.

In addition, the configuration of the local and global lines in the test groups may be arranged to measure the effect of "proportionate density" on the devices under test. Proportionate density is defined herein to differentiate the areas of local or global density that have the same numeric density value, but different line widths and spacing. For example, an area of 50 percent density may be comprised of 110 nanometer lines with 110 nanometer spacing, as well as with 500 nanometer width lines and 500 nanometer width spacing. Hence, although the two above examples have the same density, they have different proportionate densities.

Figure 8:
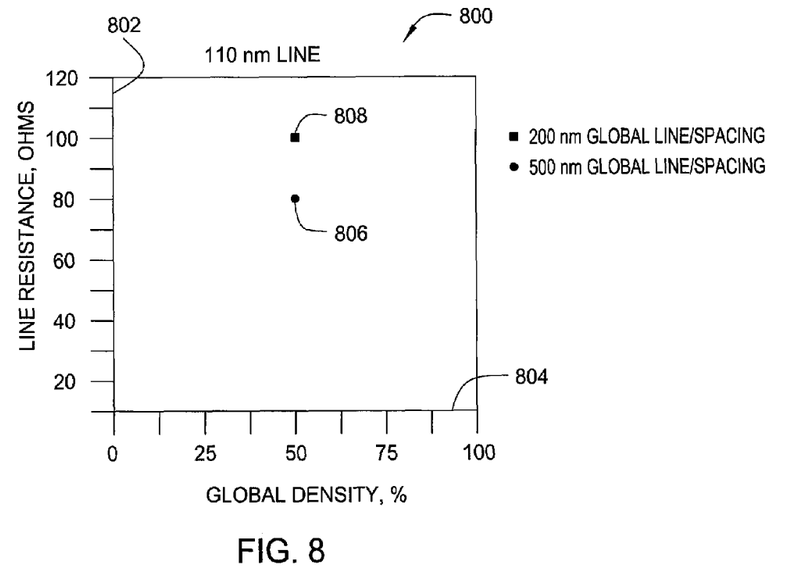
FIG. 8 is a graph of line resistance versus global density.

For example, FIG. 8 is a chart 800 depicting line resistance (axis 802) versus global density (axis 804) of a 110 nm line (e.g., DUT) for two different proportionate global densities. Data point 806 shows a line resistance of about 80 Ohms at a global density of 50 percent. The global density for data point 806 was obtained by global lines having a width and spacing of 500 nm. Data point 808 shows a line resistance of about 100 Ohms, also at a global density of 50 percent. However, the 50 percent global density for data point 808 was obtained by global lines having a width and a spacing of 200 nm. Thus, the resistance of a 110 nm line in an integrated circuit unexpectedly depends not only on the global density of the surrounding area on the chip, but also on how that global density is obtained—i.e., the line resistance depends on the proportionate global density of the integrated circuit.

The results of the analyses, e.g., the interactions between the measured characteristic of each DUT 108 on the test chip and the surrounding variables (local and global density, neighboring density, topography, proportionate density, and the like), may be stored in a database to create an information library. Information libraries may be utilized in various ways to assist in the design and fabrication of integrated circuits. For example, an information library may be used to help create or verify design rules for designing chips, or to verify existing chip designs. In addition, information libraries may be used to improve the tools available to chip designers. For example, an information library may be used to improve computer aided design (CAD) models, layout routers, extraction tools.

For example, the initial circuit layout is typically mapped out using a router. The routers have limited capability to account for the various interactions that affect an individual circuit. As such, the circuit may not operate as designed—possibly to the point of failure. In one embodiment, an information library may be used by the router to compensate for the interactions between the circuits being laid out and the influential variables discussed above, e.g., local and global densities, neighboring and proportionate densities, topography, and the like.

Alternatively or in combination, an information library may be utilized to create a CAD model that relates the line width, spacing, local density, global density, neighboring density, proportionate density, topography, and the like to the resistance of the line, or circuit. For example, a CAD model is typically used for reverse annotation, where a particular wire or conductor path of the circuit is extracted from the layout, resistance for that particular path is calculated, and the resulting resistance is placed into the model. This process is repeated to obtain the modeled resistance for each of the desired conductor paths in the circuit layout. Once all of the resistance measurements are obtained, a timing simulation may be performed to ensure that the circuit operates as desired. In embodiments where an information library is used in the router, a CAD model having the information library incorporated therein may be used to provide a double check. Alternatively, the CAD model having the information library incorporated therein may be used to verify the designed circuit layout in embodiments where conventional routers are used.

Alternatively or in combination, a test chip as described above may further be used as a calibration structure to verify the accuracy of the CAD model. For example, the CAD model may be utilized to predict the resistance of the DUTs formed on the test chip. The actual measured resistances of the test chip DUTs may be compared to the predicted values to assess the accuracy of the CAD model. The comparison data may then be utilized to modify, or calibrate the CAD model.

Through analysis using an information library as discussed above, or through analysis of information derived from use of test structures as described above, new or existing technologies can be evaluated, and the design space and process space defined for integrated circuits utilizing feature sizes and combinations as determined to have a known interaction through the analysis of the data obtained by the test chip 100.

For example, new or existing processes may be monitored utilizing the test structures to either set up a particular process or for use in process control or for process stability measurements. In one embodiment, a test chip may be set up with a smaller subset of test structures that is focused around a particular design utilized in a production chip. Typically, the device under test 108 and the global density target established by the design rule of the production chip would be replicated in the test modules 104 of the test chip 100. As such, measurements of the test chip both before and after processing enables analysis of the effect of a specific process on devices in varying regions of local and global density, neighboring density, topography, and other variables as disclosed herein. Moreover, measurements taken at different physical locations on the substrate allows for the determination of and compensation for process variability at the different locations on the substrate, e.g., center versus edge, and the like. The processes tested may be either a new process being developed or tested for potential use or an existing process that is being re-affirmed, adjusted, used with a new chip design, and the like.

In another embodiment, the small physical size of the test structures or modules 104 allows the test modules 104 to be placed within the scribe lines in a real production chip, allowing measurement and analysis of production substrates without adversely affecting the yield. This advantageously allows real-time process control and process stability measurements to be taken. In addition, measurements taken at different physical locations on the substrate allows for the determination of and compensation for process variability at the different locations on the substrate. This process monitoring methodology may be utilized for any process during the fabrication of the computer chip, such as etch, CMP, and the like.

Such tests either utilizing embodiments of the test chip used in technology set up or in the process monitoring set up, as described above, may also be re-run or re-evaluated whenever there is a change in operating conditions, such as a change in a consumable set, start of a new batch or lot of substrates, after cleaning processes, or after recalibration of the process chamber.

Thus, a novel test structure is provided having a compact structure useful for testchips as well as in scribeline test structures. The structures may be electrically or physically tested. For example, resistance measurements may be taken to provide CMP, lithography, and etching influences on the test structures. The test structures may also be physically tested, for example by stylus or probe profilers, optical critical dimension (OCD), atomic force microscopes (AFM), and the like. The compact structures may be easily arranged to provide high spatial resolution test structures which give a clear picture of resistance variability across a wafer. In addition, the effect of the underlying topography of the substrate may also be determined.

Also provided are novel methods for creating a design library characterizing the resistance of lines formed on a semiconductor substrate as a function of line width, spacing, local and global density, underlying topography, and the like. The design library can be used by chip designers to predict the performance of structures formed on an integrated circuit (IC) and thereby create design rules for the creation of ICs and/or to predict the effect of certain processes on the IC structures. The test structures can also be used for process monitoring during fabrication of integrated circuits to detect process variation or movement.

While the foregoing is directed to embodiments of the present invention, other and further embodiments of the invention may be devised without departing from the basic scope thereof, and the scope thereof is determined by the claims that follow.

The invention claimed is:

1. A method of determining the effect of surrounding structures on a test structure formed on a semiconductor substrate, comprising:
providing a substrate having a test group formed thereon, the test group comprising:
a test element having a first side and an opposing second side;
one or more structures defining a first region having a first local density adjacent the first side of the test element;
one or more structures defining a second region having a second local density adjacent the second side of the test element;
one or more structures defining a third region having a first global density adjacent the first region; and
one or more structures defining a fourth region having a second global density adjacent the second region; and
taking a first measurement of a characteristic of the test element.

2. The method of claim 1, wherein the step of taking a first measurement further comprises optically measuring a characteristic of the test element.

3. The method of claim 1, wherein the step of taking a first measurement further comprises optically measuring a characteristic of the test element using at least one of optical critical dimension, atomic force microscopy, or electrostatic force microscopy.

4. The method of claim 1, wherein the step of taking a first measurement further comprises physically measuring a characteristic of the test element.

5. The method of claim 1, wherein the step of taking a first measurement further comprises physically measuring a characteristic of the test element using at least one of a mechanical probe, a stylus, or an electrical probe.

6. The method of claim 1, wherein the step of taking a first measurement further comprises obtaining an electrical measurement of the test element.

7. The method of claim 1, wherein the step of taking a first measurement further comprises obtaining an electrical resistance measurement of the test element.

8. The method of claim 1, further comprising determining the effect of at least one of the local density, the global density, the neighboring density, the proportionate density, or the underlying topography on the characteristic.

9. The method of claim 1, further comprising:
performing a process on the test group; and
taking a second measurement of the characteristic of the test element.

10. The method of claim 9, further comprising comparing the first and the second measurement.

11. The method of claim 10, further comprising storing data representative of the comparison between the first and the second measurements in a database.

12. The method of claim 10, wherein the substrate has a plurality of test elements formed thereon, and wherein data representing comparisons of measurements taken of the plurality of test elements are stored in the database.

13. A method of forming an information library for use in designing or fabricating integrated circuits, comprising:

providing a test chip having one or more test modules formed thereon, each test module having one or more test groups comprising:
   a test element having a first side and an opposing second side;
   a first and a second region of local density respectively adjacent the first and the second side of the test element; and
   a first and a second region of global density respectively adjacent the first and the second region of local density;
measuring a characteristic of one or more of the test elements; and
storing data representing the measured characteristic in a database.

14. The method of claim 13, wherein the one or more test modules is a plurality of test modules, each of the test modules containing a plurality of test groups, each of the test groups having different combinations of at least one of line widths, local density, global density, proportionate density, and underlying topography.

15. The method of claim 13, further comprising:
using the stored data to create one or more design rules defining the interrelation between the width of a feature to be formed on a semiconductor device and a local and a global density surrounding the feature.

16. The method of claim 13, further comprising:
storing data in the database representative of at least one of the local density, the global density, a width of the test element, a depth of the test element, a neighboring density, and a characteristic of a region of the substrate disposed beneath the test element.

17. The method of claim 13, further comprising storing data in the database representative of processes performed on the test element.

18. The method of claim 13, wherein the step of providing a test chip further comprises providing a test chip having a test element having a width of less than about 330 nanometers.

19. The method of claim 13, wherein the step of providing a test chip further comprises providing a test chip having a test element having a width of less than about 220 nanometers.

20. The method of claim 13, wherein the step of providing a test chip further comprises providing a test chip having a test element having a width of less than about 110 nanometers.

21. The method of claim 13, wherein the step of providing a test chip further comprises providing a test chip having a test element having a depth of about 2000 to about 3000 angstroms.

* * * * *

UNITED STATES PATENT AND TRADEMARK OFFICE
CERTIFICATE OF CORRECTION

PATENT NO. : 7,459,319 B2  
APPLICATION NO. : 11/681843  
DATED : December 2, 2008  
INVENTOR(S) : Smayling et al.

Page 1 of 1

It is certified that error appears in the above-identified patent and that said Letters Patent is hereby corrected as shown below:

In the Detailed Description:

Column 5, Line 65, please delete "11 A-B" and insert --110 A-B-- therefor.

Signed and Sealed this

Twenty-first Day of April, 2009

JOHN DOLL  
*Acting Director of the United States Patent and Trademark Office*